(12) United States Patent
Wang et al.

(10) Patent No.: US 11,444,573 B1
(45) Date of Patent: Sep. 13, 2022

(54) OSCILLATOR

(71) Applicant: KaiKuTek Inc., Taipei (TW)

(72) Inventors: Mike Chun-Hung Wang, Taipei (TW); Chen-Lun Lin, Taipei (TW); Guan-Sian Wu, Taichung (TW); Chin-Wei Kuo, Taichung (TW); Ming Wei Kung, Tainan (TW); Wen-Sheng Cheng, Taipei (TW); Chun-Hsuan Kuo, San Diego, CA (US)

(73) Assignee: KaiKuTek Inc., Taipei (TW)

( * ) Notice: Subject to any disclaimer, the term of this patent is extended or adjusted under 35 U.S.C. 154(b) by 0 days.

(21) Appl. No.: 17/477,688

(22) Filed: Sep. 17, 2021

(51) Int. Cl.
*H03B 5/24* (2006.01)
*H03K 3/0231* (2006.01)
*H03K 19/20* (2006.01)

(52) U.S. Cl.
CPC ............ *H03B 5/24* (2013.01); *H03K 3/0231* (2013.01); *H03K 19/20* (2013.01); *H03B 2200/004* (2013.01)

(58) Field of Classification Search
CPC ...... H03B 5/20; H03B 2200/004; H03B 5/24; H03K 3/023; H03K 3/0231
USPC .................................. 331/111, 143–145, 153
See application file for complete search history.

(56) References Cited

U.S. PATENT DOCUMENTS

| 4,623,852 | A | * | 11/1986 | Abou | ...................... H03K 3/354 |
| | | | | | 331/34 |
| 6,633,194 | B2 | | 10/2003 | Arnborg et al. | |
| 7,385,453 | B2 | * | 6/2008 | Nervegna | ............... H03K 3/011 |
| | | | | | 331/177 V |
| 7,432,771 | B2 | * | 10/2008 | Chui | ...................... H03K 4/502 |
| | | | | | 331/113 R |
| 8,198,947 | B2 | * | 6/2012 | Schatzberger | ......... H03K 3/354 |
| | | | | | 331/111 |
| 8,457,586 | B2 | | 6/2013 | Syu | |
| 8,988,157 | B2 | * | 3/2015 | Tokairin | .................... H03L 7/02 |
| | | | | | 331/1 R |

(Continued)

FOREIGN PATENT DOCUMENTS

| CN | 112910416 A | 6/2021 |
| TW | 494617 B | 7/2002 |

(Continued)

*Primary Examiner* — Levi Gannon
(74) *Attorney, Agent, or Firm* — Alan D. Kamrath; Karin L. Williams; Mayer & Williams PC (57) ABSTRACT

The invention discloses an oscillator, including a voltage switching circuit, a voltage adjustment circuit and a frequency generation circuit. The voltage switching circuit receives an output voltage signal whereby the output voltage signal switches a first input voltage signal to a first voltage level signal and switches a second input voltage signal to a second voltage level signal. The voltage adjustment circuit receives the first voltage level signal and the second voltage level signal, whereby the first voltage level signal and the second voltage level signal generate the first adjustment voltage signal and the second adjustment voltage signal. The frequency generation circuit is connected to the voltage adjustment circuit, and receives the first adjustment voltage signal and the second adjustment voltage signal to generate the first output frequency signal and the second output frequency signal according to the first adjustment voltage signal and the second adjustment voltage signal.

6 Claims, 5 Drawing Sheets

(56) References Cited

U.S. PATENT DOCUMENTS

| | | | | |
|---|---|---|---|---|
| 9,401,703 | B1 * | 7/2016 | Wang | H03K 3/0231 |
| 9,503,059 | B1 * | 11/2016 | Margarit | H03K 3/0231 |
| 10,651,794 | B1 | 5/2020 | Lin et al. | |
| 2018/0351538 | A1 * | 12/2018 | Tanaka | H03K 3/0231 |

FOREIGN PATENT DOCUMENTS

| | | |
|---|---|---|
| TW | I430591 B | 3/2014 |
| TW | I686054 B | 2/2020 |

* cited by examiner

OSCILLATOR

BACKGROUND OF THE INVENTION

1. Field of the Invention

The present invention relates to an oscillator, and more particularly, an oscillator without crystals.

2. Description of the Related Art

The oscillator is one of the widely used circuits, which is utilized to generate a signal with an oscillation frequency for a frequency signal source of each electronic product. Since the present oscillator utilizes crystals for the signal source, the manufacturing cost of the oscillator increases and the circuit of the oscillator is complex.

Accordingly, it is urgent to provide an oscillator without crystals to solve the problem mentioned above.

SUMMARY OF THE INVENTION

To overcome the shortcomings, the present invention discloses an oscillator, including a voltage switching circuit, a voltage adjustment circuit, and a frequency generation circuit. The voltage switching circuit is electrically connected to a first output terminal and a second output terminal, and receives a first output voltage signal and a second output voltage signal generated by the first output terminal and second output terminal, whereby the first output voltage signal and the second output voltage signal switch the first input voltage signal to a first voltage level signal and switch the second input voltage signal to a second voltage level signal. The first voltage level signal is an inverted signal of the second voltage level signal, the first output voltage signal is an inverted signal of the second output voltage signal, and the first voltage level signal is an inverted signal of the second voltage level signal. The voltage adjustment circuit is electrically connected to the voltage switching circuit and receives the first voltage level signal and the second voltage level signal, whereby the first voltage level signal and the second voltage level signal generate a first adjustment voltage signal and a second adjustment voltage signal. The frequency generation circuit is electrically connected to the voltage adjustment circuit and receives the first adjustment voltage signal and the second adjustment voltage signal to generate the first output frequency signal and the second output frequency signal according to the first adjustment voltage signal and the second adjustment voltage signal.

As mentioned above, the oscillator of the present invention can generate an adjustable oscillation frequency without the crystals by the simple circuit. Therefore, the oscillator of the present invention has the advantages including low cost, simple design, and adjustable architecture.

DETAILED DESCRIPTION OF THE INVENTION

Figure 1:
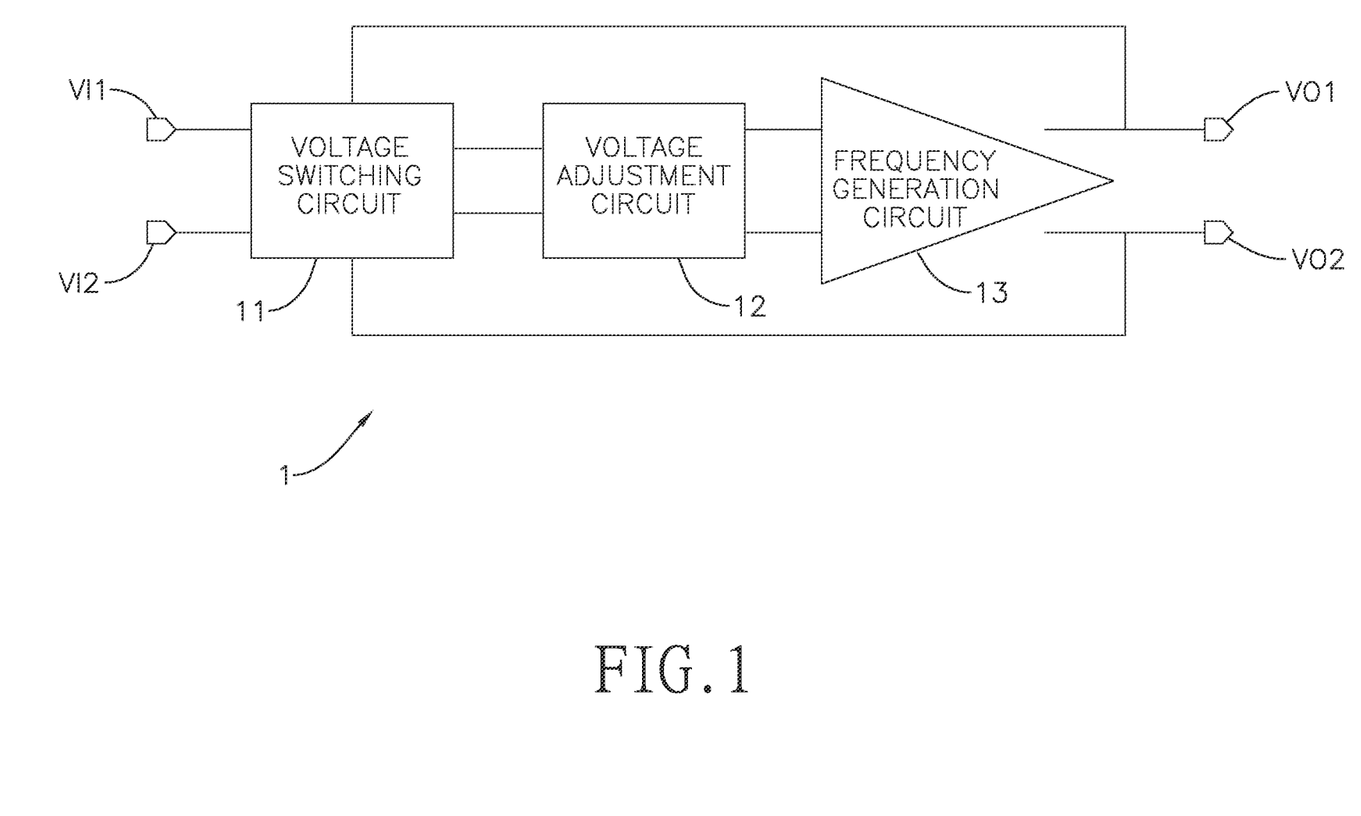
FIG. 1 is a block diagram of the oscillator of the present invention.
Figure 2:
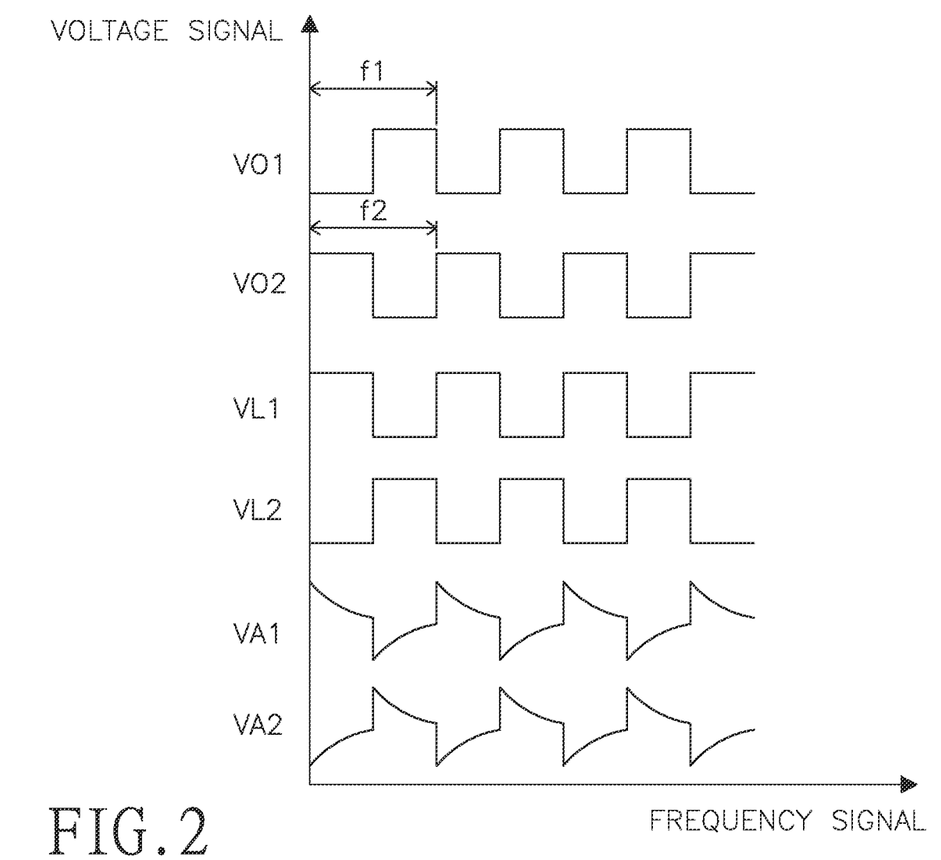
FIG. 2 is a phase diagram of each voltage signal and each output frequency signal of the oscillator of the present invention.

With reference to FIG. 1 and FIG. 2, FIG. 1 and FIG. 2 are the block diagram of the oscillator and the phase diagram, respectively, of each voltage signal and each output frequency signal of the present invention. The oscillator 1 includes a voltage switching circuit 11, a voltage adjustment circuit 12 and a frequency generation circuit 13. The voltage switching circuit 11 has a first input terminal and a second input terminal. The first input terminal receives a first input voltage signal VI1. The second input terminal receives a second input voltage signal VI2. The voltage switching circuit 11 is further electrically connected to a first output terminal and a second output terminal of the oscillator 1 and receives a first output voltage signal VO1 and a second output voltage signal VO2 outputted from the first output terminal and the second output terminal of the oscillator 1, whereby the first output voltage signal VO1 and the second output voltage signal VO2 switch the first input voltage signal VI1 to a first voltage level signal VL1 and switch the second input voltage signal VI2 to a second voltage level signal VL2. The first voltage level signal VL1 is an inverted signal of the second voltage level signal VL2. The voltage adjustment circuit 12 is electrically connected to the voltage switching circuit 11 and receives the first voltage level signal-VL1 and the second voltage level signal VL2, whereby the first voltage level signal VL1 and the second voltage level signal VL2 generate a first adjustment voltage signal VA1 and a second adjustment voltage signal VA2. The frequency generation circuit 13 is electrically connected to the voltage adjustment circuit 12 and receives the first adjustment voltage signal VA1 and the second adjustment voltage signal VA2 so as to generate the first output voltage signal VO1 with a first output frequency signal f1 and the second output voltage signal VO2 with a second output frequency signal f2 according to the first adjustment voltage signal VA1 and the second adjustment voltage signal VA2. The first output frequency signal f1 is an inverted signal of the second output frequency signal f2.

Figure 3:
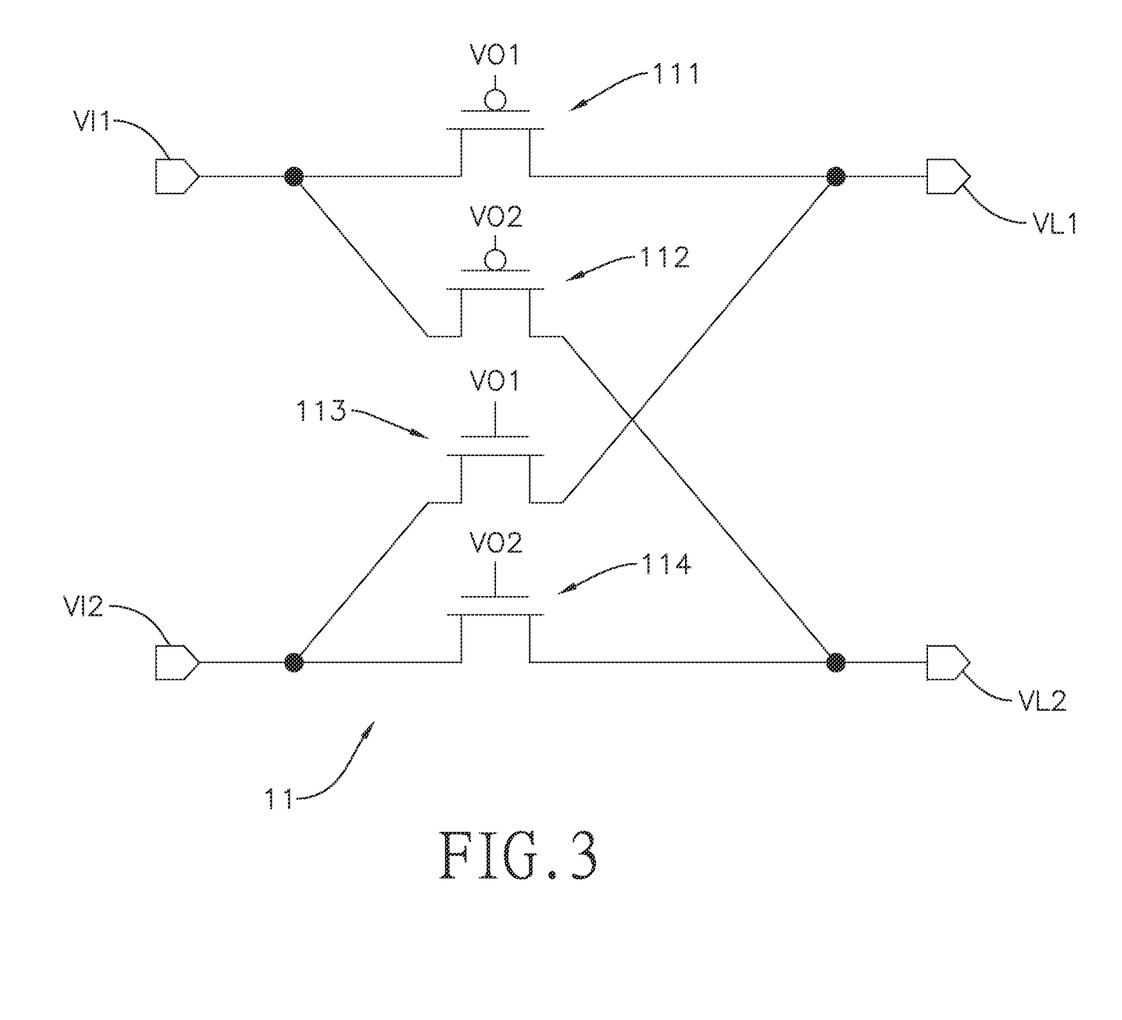
FIG. 3 is a voltage switching circuit diagram of the oscillator of the present invention.

With reference to FIG. 3, FIG. 3 is the voltage switching circuit diagram of the oscillator of the present invention. The voltage switching circuit 11 includes a first transistor switch 111, a second transistor switch 112, a third transistor switch 113, and a fourth transistor switch 114. The first transistor switch 111 and the second transistor switch 112 are P-channel Metal Oxide Semiconductor (PMOS) FET. The third transistor switch 113 and the fourth transistor switch 114 are N-channel Metal Oxide Semiconductor (NMOS) FET. The first transistor switch 111 has a first reception terminal, a first driven terminal, and a first output terminal. The first reception terminal receives the first input voltage signal VI1. The first driven terminal receives the first output voltage signal VO1. The first transistor switch 111 is enabled or disabled according to the first output voltage signal VO1. The first signal of the first output terminal is varied with the first output voltage signal VO1 and the first input voltage signal VI1. The second transistor switch 112 has a second reception terminal, a second driven terminal, and a second output terminal. The second reception terminal receives the first input voltage signal VI1. The second driven terminal receives the second output voltage signal VO2. The second transistor switch 112 is enabled or disabled according to the second output voltage signal VO2. The second signal of the second output terminal is varied with the second output voltage signal VO2 and the first input voltage signal VI1. The third transistor switch 113 has a third reception terminal, a third driven terminal, and a third output terminal. The third reception terminal receives the second input voltage signal VI2. The third driven terminal receives the first output voltage signal VO1. The third transistor switch 113 is enabled or disabled according to first output voltage signal VO1. The third signal of the third output terminal is varied with the first output voltage signal VO1 and the second input voltage signal VI2. The fourth transistor switch 114 has a fourth reception terminal, a fourth driven terminal, and a fourth output terminal. The fourth reception terminal receives the second input voltage signal VI2. The fourth driven terminal receives the second output voltage signal VO2. The fourth transistor switch 114 is enabled or disabled according to second output voltage signal VO2. The fourth signal of the fourth output terminal is varied with the second output voltage signal VO2 and the second input voltage signal VI2. The first voltage level signal VL1 is an inverted signal of the second voltage level signal VL2.

As mentioned above, in an embodiment of the present invention, when the third driven terminal of the third transistor switch 113 receives the first output voltage signal VO1 that is the high voltage level, the third transistor switch 113 is enabled to switch the third signal of the third output terminal as the first voltage level signal VL1 according to the first output voltage signal VO1 and the second input voltage signal VI2. At the meantime, the second output voltage signal VO2 is the inverted signal of the first output voltage signal VO1. Therefore, the second transistor switch 112 is enabled to switch the second signal of the second output terminal as the second voltage level signal VL2 according to the second output voltage signal VO2 and the first input voltage signal VI1. Similarly, when the first driven terminal of the first transistor switch 111 receives the first output voltage signal VO1 that is the low voltage level, the first transistor switch 111 is enabled to switch the first signal of the first output terminal as the first voltage level signal VL1 according to the first output voltage signal VO1 and the first input voltage signal VIL. At the meantime, the second output voltage signal VO2 is the inverted signal of the first output voltage signal VO1. Therefore, the fourth transistor switch 114 is enabled to switch the fourth signal of the fourth output terminal as the second voltage level signal VL2 according to the second output voltage signal VO2 and the second input voltage signal VI2. The first voltage level signal VL1 is the inverted signal of the second voltage level signal VL2. The operation of the other transistor switches is similar to the aforementioned embodiments and the details are omitted here.

Figure 4:
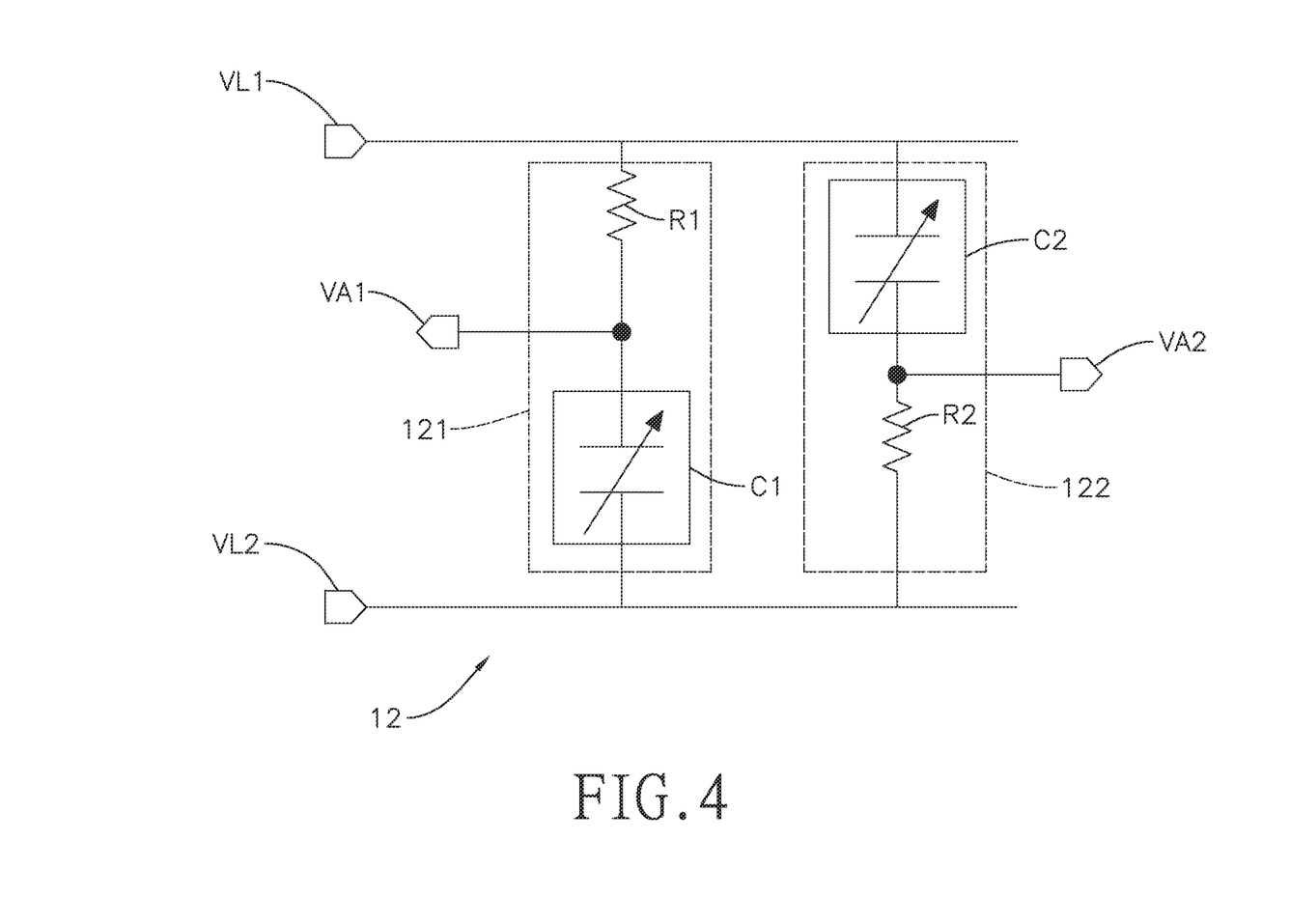
FIG. 4 is a voltage adjustment circuit diagram of the oscillator of the present invention.

With reference to FIG. 4, FIG. 4 is the voltage adjustment circuit diagram of the oscillator of the present invention. The voltage adjustment circuit 12 comprises a first charging-and-discharging element 121 and a second charging-and-discharging element 122. The first charging-and-discharging element 121 charges or discharges according to the first voltage level signal VL1 or the second voltage level signal VL2 generated by the voltage switching circuit 11. The second charging-and-discharging element 122 charges or discharges according to the first voltage level signal VL1 or the second voltage level signal VL2 generated by the voltage switching circuit 11. In the embodiment, the first charging-and-discharging element 121 includes a first resistance R1 and a first variable capacitor C1. The first end of the first resistance R1 receives the first voltage level signal VL1. The second end of the first resistance R1 is connected to the first end of the first variable capacitor C1. The second end of the first variable capacitor C1 receives the second voltage level signal VL2. The second charging-and-discharging element 122 comprises a second resistance R2 and a second variable capacitor C2. The first end of the second resistance R2 receives the second voltage level signal VL2. The second end of the second resistance R2 is connected to the first end of the second variable capacitor C2. The second end of the first variable capacitor C2 receives the first voltage level signal VL1. The first adjustment voltage signal VA1 is variable by adjusting the first variable capacitor C1. That is, by adjusting the time constant of the first charging-and-discharging element 121, the charging and discharging rate of the first charging-and-discharging element 121 can be changed to adjust the voltage of the first adjustment voltage signal VA1. The second adjustment voltage signal VA2 is variable by adjusting the second variable capacitor C2. That is, by adjusting the time constant of the second charging-and-discharging element 122, the charging and discharging rate of the second charging-and-discharging element 122 can be changed to adjust the voltage of the second adjustment voltage signal VA2.

As mentioned above, when the first voltage level signal VL1 is at the high voltage level, the first variable capacitor C1 is charged by the first voltage level signal VL1 via the first resistance R1. After that, the first adjustment voltage signal VA1 at one terminal of the first variable capacitor C1 is at the high voltage level. In contrast, when the second voltage level signal VL2 is at the low voltage level, the second variable capacitor C2 discharges via the second resistance R2. After that, second adjustment voltage signal VA2 at the other terminal of the second variable capacitor C2 is at the low voltage level. Similarly, when the first voltage level signal VL1 is at the low voltage level, the first variable capacitor C1 is discharged via the first resistance R1. After that, the first adjustment voltage signal VA1 at one terminal of the first variable capacitor C1 is at the low voltage level. In contrast, when the second voltage level signal VL2 is at the high voltage level, the second variable capacitor C2 is charged via the second resistance R2. After that, the second adjustment voltage signal VA2 at the other terminal of the second variable capacitor C2 is at the high voltage level.

Figure 5:
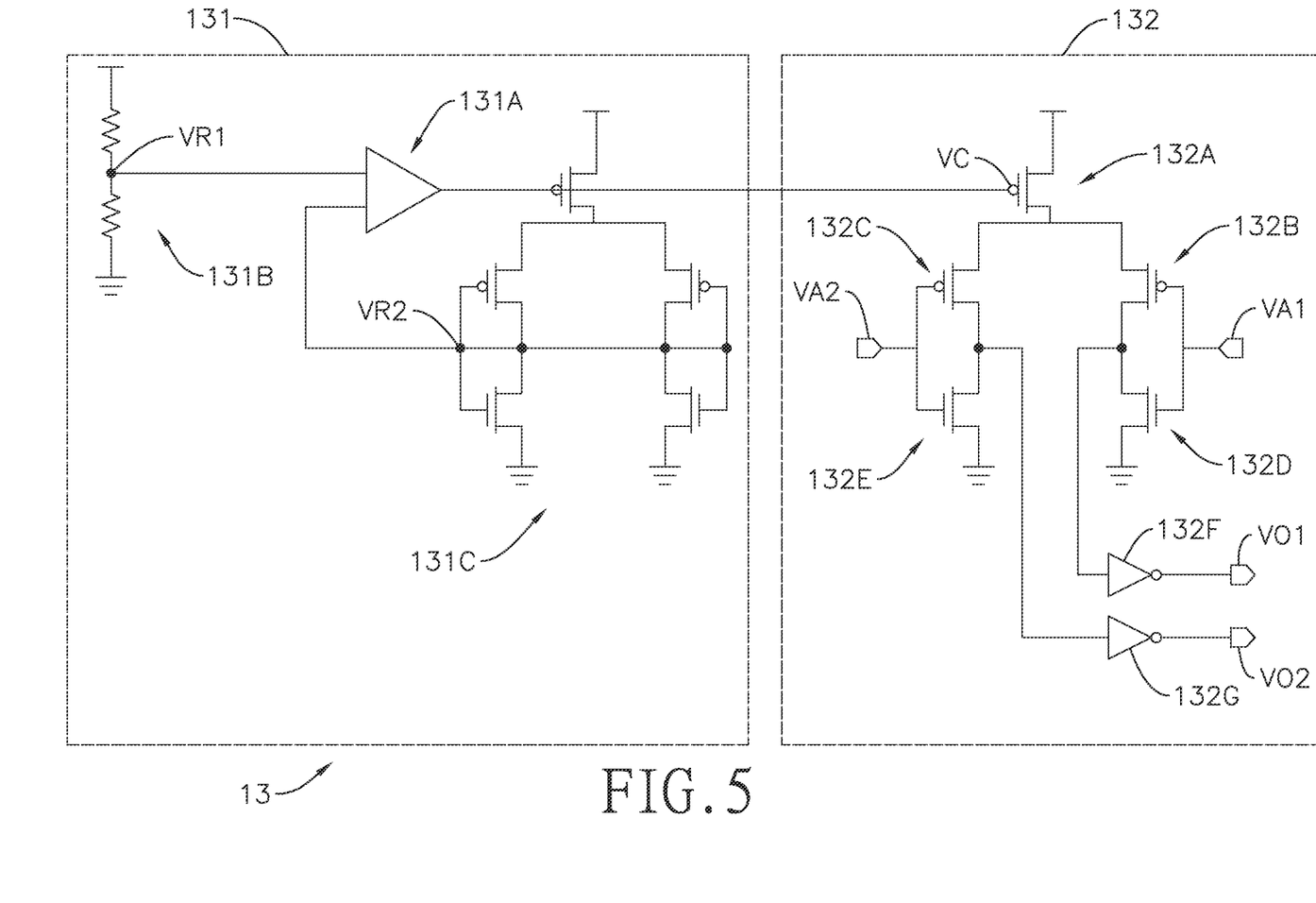
FIG. 5 is a frequency generation circuit diagram of the oscillator of the present invention.

With reference to FIG. 5, FIG. 5 is the frequency generation circuit diagram of the oscillator of the present invention. The frequency generation circuit 13 includes a constant-voltage circuit 131 and a reverse bias comparator circuit 132. The constant-voltage circuit 131 output a constant-voltage signal VC to the reverse bias comparator circuit 132. The reverse bias comparator circuit 132 is electrically connected to the constant-voltage circuit 131 and the voltage adjustment circuit 12, receives the constant-voltage signal VC generated by the constant-voltage circuit 131, receives the first adjustment voltage signal VA1 and the second adjustment voltage signal VA2 generated by the voltage adjustment circuit 12, and generates the first output voltage signal VO1 with the first output frequency signal f1 and the second output voltage signal VO2 with the second output frequency signal f2 according to the constant-voltage signal VC, the first adjustment voltage signal VA1, and the second adjustment voltage signal VA2.

The constant-voltage circuit 131 includes an error amplifier 131A, a bias circuit 131B, and a duplicate circuit 131C. The error amplifier 131A has a first input terminal, a second input terminal, and an output terminal. The bias circuit 131B is electrically connected to the high voltage terminal, the low voltage terminal, and the first input terminal of the error amplifier 131A to generate a bias voltage signal VR1 to the first input terminal of the error amplifier 131A. The duplicate circuit 131C is electrically connected to the high voltage terminal, the low voltage terminal, and the output terminal and the second input terminal of the error amplifier 131A to generate a duplicate voltage signal VR2 to the second input terminal of the error amplifier 131A. The error amplifier 131A generates a comparison result by comparing the bias voltage signal VR1 and the duplicate voltage signal VR2. The error amplifier 131A generates a constant-voltage signal VC to the duplicate circuit 131C and the reverse bias comparator circuit 132 according to the comparison result.

The reverse bias comparator circuit 132 comprises a fifth transistor switch 132A, a sixth transistor switch 132B, a seventh transistor switch 132C, an eighth transistor switch 132D, a ninth transistor switch 132E, a first inverter 132F, and a second inverter 132G. The fifth transistor switch 132A, the sixth transistor switch 132B, and the seventh transistor switch 132C are PMOS FETs. The eighth transistor switch 132D and the ninth transistor switch 132E are NMOS FETs. The drain terminal of the fifth transistor switch 132A is connected to the high voltage terminal. The gate terminal of the fifth transistor switch 132A is connected to the output terminal of the constant-voltage circuit 131. The fifth transistor switch 132A is enabled or disabled according to the constant-voltage signal VC generated by the constant-voltage circuit 131. Since the voltage of the constant-voltage signal VC generated by the constant-voltage circuit 131 is constant, the fifth transistor switch 132A is normally enabled. The gate of the sixth transistor switch 132B is connected to the gate of the eighth transistor switch 132D and receives the first adjustment voltage signal VA1. The source terminal of the sixth transistor switch 132B is connected to the drain of the eighth transistor switch 132D and connected to the input terminal of the first inverter 132F. The source terminal of the eighth transistor switch 132D is connected to the low voltage terminal. The gate of the seventh transistor switch 132C is connected to the gate of the ninth transistor switch 132E and receives the second adjustment voltage signal VA2. The source terminal of the seventh transistor switch 132C is connected to the drain of the ninth transistor switch 132E and connected to the input terminal of the second inverter 132G. The source terminal of the ninth transistor switch 132E is connected to the low voltage terminal.

As mentioned above, when the first adjustment voltage signal VA1 is at the high voltage level, the eighth transistor switch 132D is enabled. Therefore, the input terminal of the first inverter 132F is at the low voltage level and the output terminal of the first inverter 132F inversely outputs the first output voltage signal VO1 with the first output frequency signal f1. The first output voltage signal VO1 is the high voltage level. When the first adjustment voltage signal VA1 is at the high voltage level, the second adjustment voltage signal VA2 is at the low voltage level correspondingly and the seventh transistor switch 132C is enabled. Consequently, the input terminal of the second inverter 132G is at the high voltage level and the output terminal of the second inverter 132G inversely outputs the second output voltage signal VO2 with the second output frequency signal f2, wherein the second output voltage signal VO2 is the low voltage level. Similarly, when the first adjustment voltage signal VA1 is at the low voltage level, the sixth transistor switch 132B is enabled. Hence, the input terminal of the first inverter 132F is at the high voltage level and the output terminal of the first inverter 132F inversely outputs the first output voltage signal VO1 with the first output frequency signal f1, wherein the first output voltage signal VO1 is the low voltage level. When the first adjustment voltage signal VA1 is at the low voltage level, the second adjustment voltage signal VA2 is at the high voltage level correspondingly and the ninth transistor switch 132E is enabled. As the result, the input terminal of the second inverter 132G is at the low voltage level and the output terminal of the second inverter 132G inversely outputs the second output voltage signal VO2 with the second output frequency signal f2. The second output voltage signal VO2 is the high voltage level, and the first output frequency signal f1 is the inverted signal of the second output frequency signal f2.

In summary, the oscillator of the present invention can generate an adjustable oscillation frequency without the crystals by the simple circuit. Therefore, the oscillator of the present invention has the advantages including low cost, simple design, and adjustable architecture.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. An oscillator, comprising:
a voltage switching circuit, electrically connected to a first output terminal and a second output terminal and receiving a first output voltage signal generated by the first output terminal and a second output voltage signal generated by the second output terminal, whereby the first output voltage signal and the second output voltage signal switch a first input voltage signal to a first voltage level signal and switches a second input voltage signal to a second voltage level signal; wherein the first voltage level signal is an inverted signal of the second voltage level signal, and the first output voltage signal is an inverted signal of the second output voltage signal;
a voltage adjustment circuit, electrically connected to the voltage switching circuit, and receiving the first voltage level signal and the second voltage level signal, whereby the first voltage level signal and the second voltage level signal generate a first adjustment voltage signal and a second adjustment voltage signal; and
a frequency generation circuit, electrically connected to the voltage adjustment circuit, receiving the first adjustment voltage signal and the second adjustment voltage signal, and outputting a first output frequency signal and a second output frequency signal according to the first adjustment voltage signal and the second adjustment voltage signal;
wherein the frequency generation circuit comprises:
a constant-voltage circuit, outputting a constant-voltage signal; and
a reverse bias comparator circuit, electrically connected to the constant-voltage circuit and the voltage adjustment circuit, receiving the constant-voltage signal, the first adjustment voltage signal, and the second adjustment voltage signal, and generating the first output frequency signal and the second output frequency signal according to the constant-voltage signal, the first adjustment voltage signal, and the second adjustment voltage signal.

2. The oscillator as claimed in claim 1, wherein the voltage switching circuit comprises:
- a first transistor switch, having a first reception terminal, a first driven terminal, and a first output terminal; wherein the first reception terminal receives the first input voltage signal and the first driven terminal receives the first output voltage signal so that the first transistor switch is enabled or disabled according to the first output voltage signal to switch a first signal of the first output terminal as the first voltage level signal according to the first output voltage signal and the first input voltage signal;
- a second transistor switch, having a second reception terminal, a second driven terminal, and a second output terminal; wherein the second reception terminal receives the first input voltage signal, the second driven terminal receives the second output voltage signal so that the second transistor switch is enabled or disabled according to the second output voltage signal to switch a second signal of the second output terminal as the second voltage level signal according to the second output voltage signal and the first input voltage signal;
- a third transistor switch, having a third reception terminal, a third driven terminal, and a third output terminal; wherein the third reception terminal receives the second input voltage signal and the third driven terminal receives the first output voltage signal so that the third transistor switch is enabled or disabled according to the first output voltage signal to switch a third signal of the third output terminal as the first voltage level signal according to the first output voltage signal and the second input voltage signal; and
- a fourth transistor switch, having a fourth reception terminal, a fourth driven terminal, and a fourth output terminal; wherein the fourth reception terminal receives the second input voltage signal and the fourth driven terminal receives the second output voltage signal so that the fourth transistor switch is enabled or disabled according to the second output voltage signal to switch a fourth signal of the fourth output terminal as the second voltage level signal according to the second output voltage signal and the second input voltage signal;
- wherein the first voltage level signal is the inverted signal of the second voltage level signal.

3. The oscillator as claimed in claim 1, wherein the voltage adjustment circuit comprises:
- a first charging-and-discharging element, having a first resistance and a first variable capacitor; wherein a first end of the first resistance receives the first voltage level signal, a second end of the first resistance is connected to a first end of the first variable capacitor, and a second end of the first variable capacitor receives the second voltage level signal; and
- a second charging-and-discharging element, having a second resistance and a second variable capacitor; wherein a first end of the second resistance receives the second voltage level signal, a second end of the second resistance is connected to a first end of the second variable capacitor, and a second end of the second variable capacitor receives the first voltage level signal;
- wherein the first adjustment voltage signal is adjusted by the first variable capacitor and the second adjustment voltage signal is adjusted by the second variable capacitor.

4. The oscillator as claimed in claim 1, wherein the constant-voltage circuit comprises:
- an error amplifier, having a first input terminal, a second input terminal, and an output terminal;
- a bias circuit, electrically connected to a high voltage terminal, a low voltage terminal, and the first input terminal of the error amplifier to generate a bias voltage signal to the first input terminal of the error amplifier; and
- a duplicate circuit, electrically connected to the high voltage terminal, the low voltage terminal and the output terminal and the second input terminal of the error amplifier to generate a duplicate voltage signal to the second input terminal of the error amplifier;
- wherein the error amplifier compares a signal level of the bias voltage signal and the duplicate voltage signal to generate the constant-voltage signal to the duplicate circuit and the reverse bias comparator circuit according to a comparison result.

5. The oscillator as claimed in claim 1, wherein the reverse bias comparator circuit comprises:
- a fifth transistor switch, connected to a high voltage terminal and receiving the constant-voltage signal generated by the constant-voltage circuit;
- a sixth transistor switch, connected to the fifth transistor switch and receiving the first adjustment voltage signal;
- a seventh transistor switch, connected to the fifth transistor switch and receiving the second adjustment voltage signal;
- an eighth transistor switch, connected to the sixth transistor switch and a low voltage terminal and receiving the first adjustment voltage signal;
- a ninth transistor switch, connected to the seventh transistor switch and the low voltage terminal and receiving the second adjustment voltage signal;
- a first inverter, having an input terminal and an output terminal; wherein the input terminal of the first inverter is connected to the sixth transistor switch and the eighth transistor switch; and
- a second inverter, having an input terminal and an output terminal; wherein the input terminal of the second inverter is connected to the seventh transistor switch and the ninth transistor switch;
- wherein the first inverter outputs the first output frequency signal according to whether the sixth transistor switch and the eighth transistor switch are enabled or disabled and the second inverter outputs the second output frequency signal according to whether the seventh transistor switch and the ninth transistor switch are enabled or disabled.

6. The oscillator as claimed in claim 1, wherein the first output frequency signal is an inverted signal of the second output frequency signal.

* * * * *